United States Patent

Kawabata et al.

Patent Number: 5,936,912
Date of Patent: Aug. 10, 1999

[54] ELECTRONIC DEVICE AND SEMICONDUCTOR MEMORY DEVICE USING THE SAME

[75] Inventors: Kuninori Kawabata; Masato Matsumiya; Satoshi Eto; Toshikazu Nakamura, all of Kawasaki; Mitsuhiro Higashiho, Kasugai; Masato Takita, Kawasaki; Toru Koga, Kawasaki; Hideki Kanou, Kawasaki; Ayako Kitamoto, Kawasaki, all of Japan

[73] Assignee: Fujitsu Limited, Kanagawa, Japan

[21] Appl. No.: 09/034,407

[22] Filed: Mar. 4, 1998

[30] Foreign Application Priority Data

Jun. 5, 1997 [JP] Japan .................................. 9-146958

[51] Int. Cl.⁶ .................................................. G11C 13/00
[52] U.S. Cl. .......................... 365/233; 327/156; 327/158; 327/159
[58] Field of Search .............................. 365/233, 189.09, 365/189.11; 327/156, 158, 159, 161

[56] References Cited

U.S. PATENT DOCUMENTS

| 5,745,011 | 4/1998 | Scott | 327/156 X |
| 5,859,551 | 1/1999 | Ohishi et al. | 327/159 |
| 5,875,219 | 2/1999 | Kim | 327/156 X |

Primary Examiner—Do Hyun Yoo
Attorney, Agent, or Firm—Nikaido Marmelstein Murray & Oram LLP

[57] ABSTRACT

An electronic device includes a first circuit which refers to an external clock and thus produces a first internal clock, and a second circuit which refers to the first internal clock and thus produces a second internal clock. The first circuit has a first phase error between the external clock and the first internal clock, and the second circuit has a second phase error between the first internal clock and the second internal clock. The first phase error has a sign reverse to that of the second phase error.

13 Claims, 19 Drawing Sheets

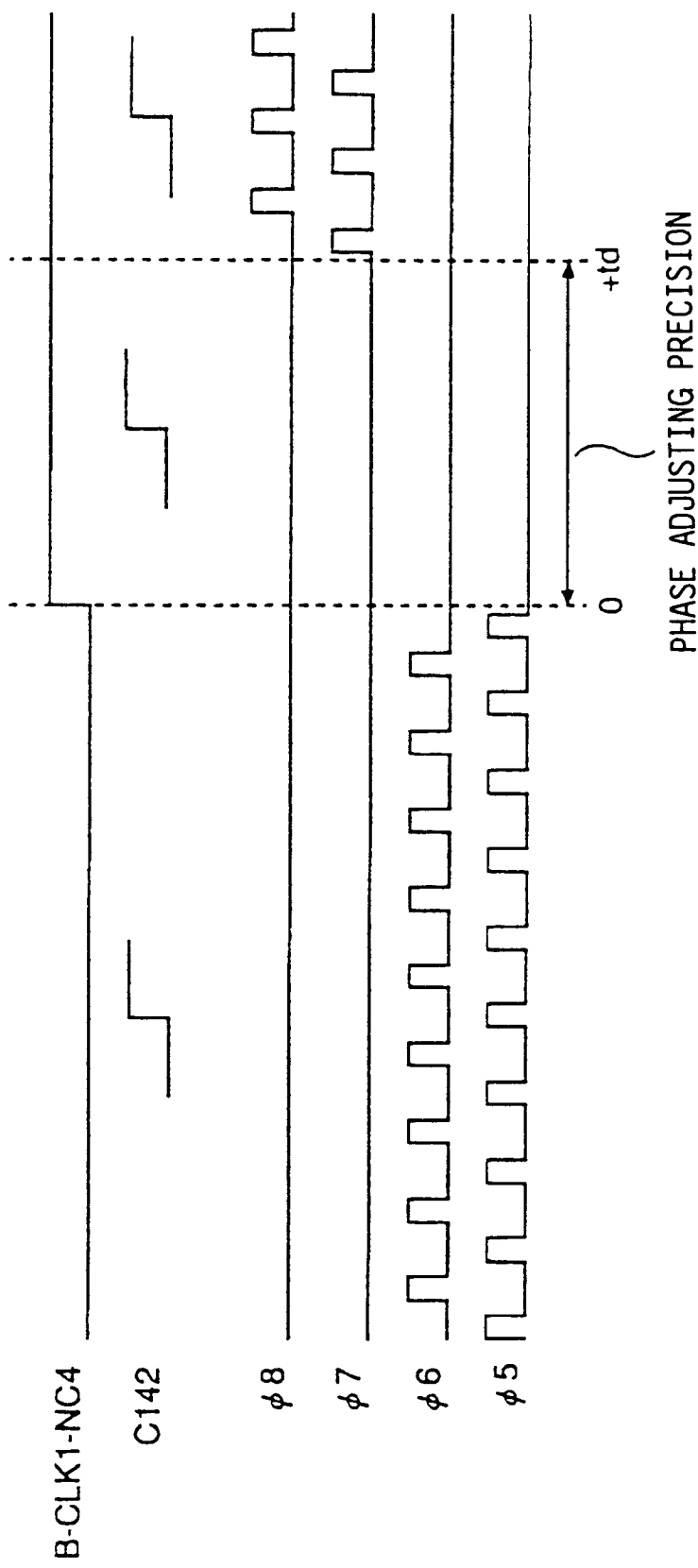

PHASE ADJUSTING ERROR

PHASE ADJUSTING ERROR

PHASE ADJUSTING ERROR

… (5,936,912)

ELECTRONIC DEVICE AND SEMICONDUCTOR MEMORY DEVICE USING THE SAME

BACKGROUND OF THE INVENTION

1. Field of the Invention

The present invention generally to clock supply devices having a delayed locked loop (DLL), and more particularly to a clock supply device in which a plurality of DLL circuits are arranged in a hierarchical formation.

2. Description of the Related Art

FIG. 1 is a circuit diagram of a conventional clock supply device having DLL circuits arranged in a hierarchical formation. The clock supply device shown in FIG. 1 includes an external clock input terminal for receiving an external clock E-CLK, and a main DLL (M-DLL) circuit 2, which delays the external clock E-CLK. The device includes an internal clock line 3 which is formed of a reciprocating wiring line over which an internal clock I-CLK output by the main DLL circuit 2 is transferred. A symbol NA1 denotes a return point, and symbols NA2 and NA3 denote nodes located in an identical distance measured from the return point NA1.

In the present configuration, the main DLL circuit 2 drives the internal clock I-CLK so that the external clock E-CLK is used as a reference clock and an internal clock I-CLK-N obtained at the return point NA1 on the internal clock line 3 is synchronized with the external clock E-CLK. A phase difference of the internal clock I-CLK-N with respect to the external clock E-CLK is a phase adjusting error −td. The phase adjusting error is a time deviation (error) of a compared clock with respect to the reference clock when assuming that a phase comparator forming the DLL circuit recognizes that the compared clock and the reference clock are in phase with each other.

The clock supply device further includes a local DLL (L-DLL) circuit 4, which compares an internal clock I-CLK-NA2 obtained at the node NA2 with an internal clock I-CLK-NA3 obtained at the node NA3, and produces a local clock L-CLK synchronized with the internal clock I-CLK-NA1 obtained at the return point NA1, that is, the external clock E-CLK. The local DLL circuit 4 recognizes, in terms of the circuit configuration, the internal clock I-CLK-NA3 as being the reference clock and recognizes the internal clock I-CLK-NA1 as being a compared clock. However, the local DLL circuit 4 drives the local clock L-CLK in a state in which the internal clock I-CLK-NA1 is handled as the reference clock and the local clock L-CLK is handled as the compared clock. The phase adjusting error of the local clock L-CLK with respect to the internal clock I-CLK-NA1 is −td.

In short, the conventional clock supply device shown in FIG. 1 is configured so that the DLL circuits 2 and 4 are arranged in the hierarchical formation and the local clock L-CLK synchronized with the external clock E-CLK is output to a circuit which needs a clock synchronized with the external clock E-25 CLK.

FIGS. 2A, 2B and 2C are timing charts of an operation of the conventional clock supply device shown in FIG. 1 and are directed to explaining problems thereof. More particularly, FIG. 2A shows a phase adjusting error of the internal clock I-CLK-NA1 with respect to the external clock E-CLK, and FIG. 2B shows a phase adjusting error of the internal clock I-CLK-NA1 in the local DLL 4. FIG. 2C shows an accumulated value of the phase adjusting errors of the main DLL circuit 2 and the local DLL circuit 4, that is, the phase adjusting error of the local clock L-CLK with respect to the external clock E-CLK.

Since the phase adjusting error of the internal clock I-CLK-NA1 with respect to the external clock E-CLK in the main DLL circuit 2 is −td, as shown in FIG. 2A, the internal clock I-CLK-NA1 is subjected to a delay control so that the rising edge of the internal clock I-CLK-NA1 is located within the range between −td and 0 with respect to the rising edge of the external clock E-CLK.

Since the phase adjusting error of the local clock L-CLK with respect to the internal clock I-CLK-NA1 in the local DLL circuit 4 is −td, as shown in FIG. 2B, the local clock L-CLK is subjected to a delay control so that the rising edge of the local clock L-CLK is located within the range between −td and 0 with respect to the rising edge of the internal clock I-CLK-NA1.

Hence, the accumulated value of the phase adjusting errors of the main DLL circuit 2, that is, the phase adjusting error of the local clock L-CLK with respect to the external clock E-CLK is equal to −2td, as shown in FIG. 2C.

When a clock supply device as described above is mounted on an SDRAM (Synchronous Dynamic Random Access Memory) device and is configured so that the local clock L-CLK is supplied to a data output circuit provided in the SDRAM device, it is required to improve the precision in synchronization of the local clock L-CLK with respect to the external clock E-CLK.

SUMMARY OF THE INVENTION

It is an object of the present invention to an electronic device capable of producing a highly precise clock so that a system using such an electronic device can have a high overall accuracy.

The above object of the present invention is achieved by an electronic device comprising: a first circuit which refers to an external clock and thus produces a first internal clock; and a second circuit which refers to the first internal clock and thus produces a second internal clock, wherein the first circuit has a first phase error between the external clock and the first internal clock, and the second circuit has a second phase error between the first internal clock and the second internal clock, the first phase error having a sign reverse to that of the second phase error.

The above electronic device may be configured so that the first circuit comprises a first delayed locked loop circuit which synchronizes the external clock and the first internal clock with each other, and the second circuit comprises a second delayed locked loop circuit which synchronizes the first and second internal clocks with each other.

The electronic device may be configured so that the first circuit comprises a first delayed locked loop circuit having the first phase error which has a negative value, and the second circuit comprises a second delayed locked loop circuit having the second phase error which has a positive value.

The electronic device may be configured so that the first circuit comprises a first delayed locked loop circuit having the first phase error which has a positive value, and the second circuit comprises a second delayed locked loop circuit having the second phase error which has a negative value.

The electronic device may be configured so that: the first circuit comprises a first delayed lock loop circuit which produces the first internal clock and a first frequency-divided clock from the external clock and outputs the first internal clock and the first frequency-divided clock to first and second clock lines; and the second circuit comprises a second delayed locked loop circuit which receives the first internal clock signal from a first node on the first clock line and the frequency-divided clock from second and third nodes on the second clock line and produce the second internal clock from the received signals.

The electronic device may be configured so that the first and second phase errors have an identical absolute value.

Another object of the present invention is to provide a semiconductor memory device using the above electronic device.

This object is achieved by A semiconductor memory device comprising: a memory core having memory cells; a control circuit which controls the meomry core; and a timing control circuit which defines an operation timing of the control circuit. The timing control circuit comporises: a first circuit which refers to an external clock and thus produces a first internal clock; and a second circuit which refers to the first internal clock and thus produces a second internal clock applied to the control circuit, wherein the first circuit has a first phase error between the external clock and the first internal clock, and the second circuit has a second phase error between the first internal clock and the second internal clock, the first phase error having a sign reverse to that of the second phase error.

BRIEF DESCRIPTION OF THE DRAWINGS

Other objects, features and advantages of the present invention will become more apparent from the following detailed description when read in conjunction with the accompanying drawings in which:

FIG. 16 is a timing chart of an operation of the phase comparator 143;

DESCRIPTION OF THE PREFERRED EMBODIMENTS

Figure 1:
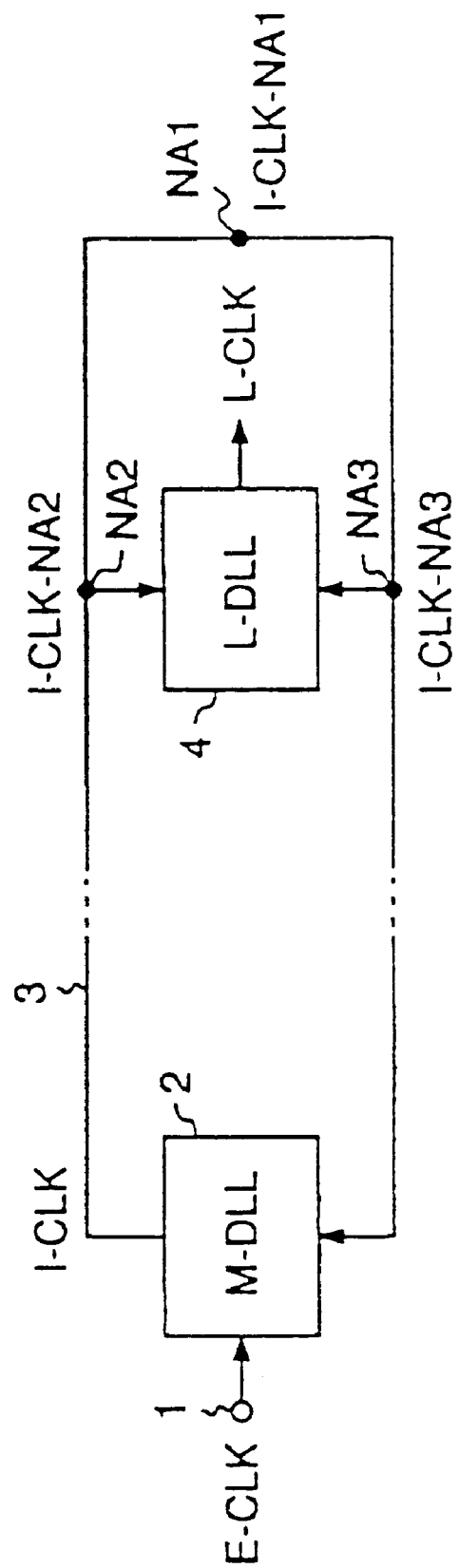
FIG. 1 is a block diagram of a conventional clock supply device.
Figure 2A:
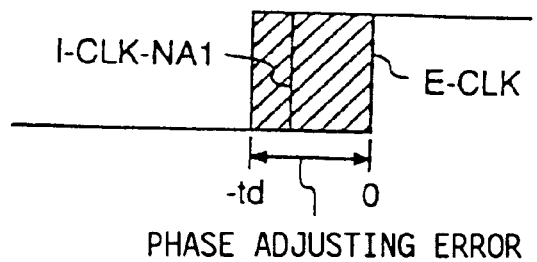
FIGS. 2A, 2B and 2C are timing charts of an operation of the conventional clock supply device shown in FIG. 1.
Figure 2B:
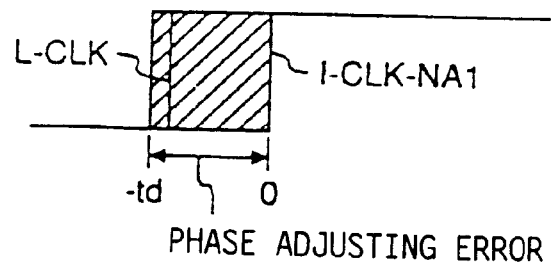
Figure 2C:
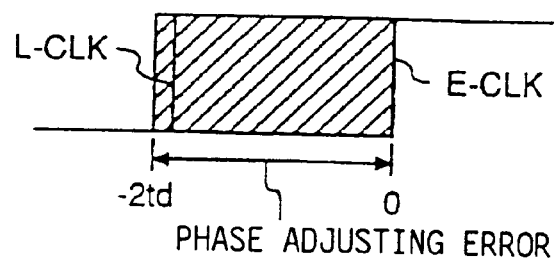
Figure 3:
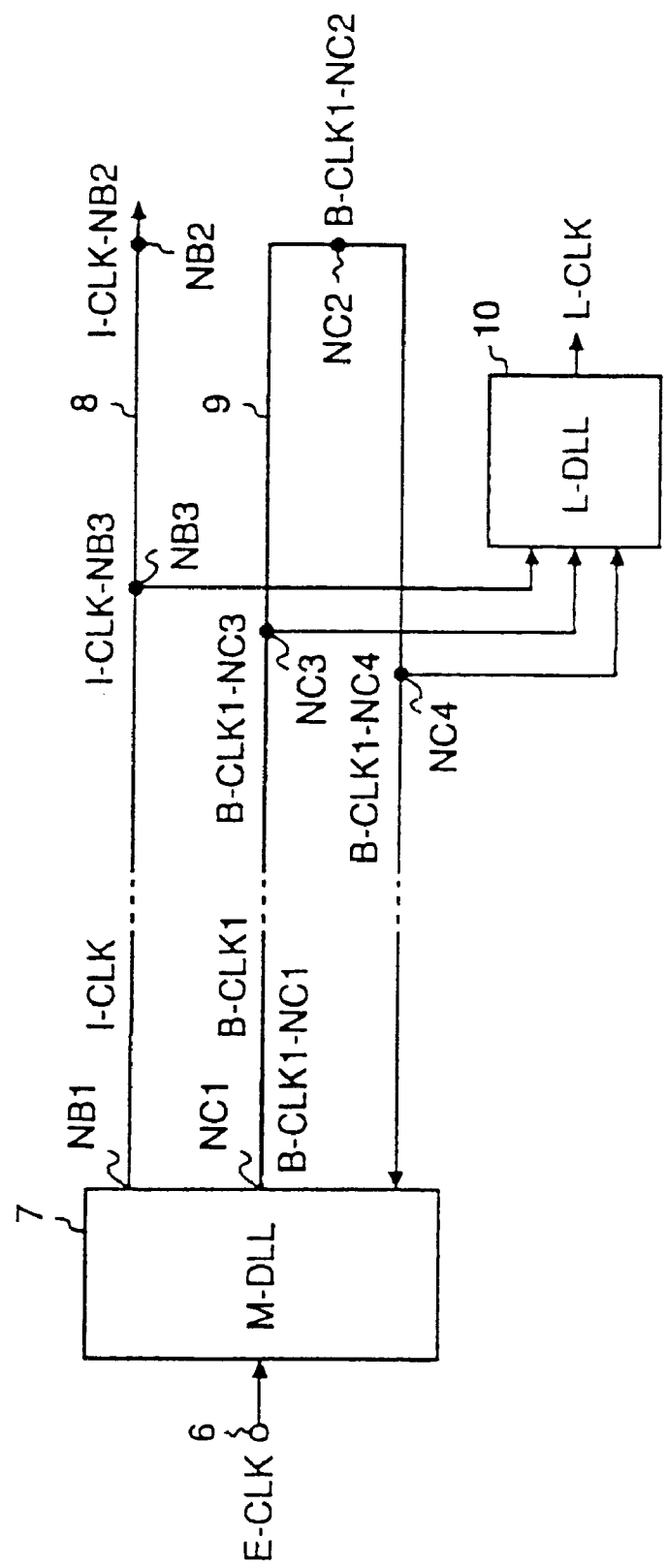
FIG. 3 is a block diagram of an electronic device according to an embodiment of the present invention.

FIG. 3 is a block diagram of a clock supply device which is an electronic device according to an embodiment of the present invention.

The clock supply device includes an external clock input terminal 6 for receiving the external clock E-CLK, and a main DLL circuit 7, which produces an internal clock I-CLK obtained by delaying the external clock E-CLK and a frequency-divided clock B-CLK1 obtained by frequency-dividing the internal clock I-CLK. A symbol NB1 denotes an output terminal of the main DLL circuit 7 via which the internal clock I-CLK is output, and a symbol NC1 denotes an output terminal thereof via which the frequency-divided clock B-CLK1 is output.

The clock supply device also includes an internal clock line 8 formed of a reciprocating wiring line over which the internal clock I-CLK output by the main DLL circuit 7 is transferred. Further, the clock supply device includes a frequency-divided clock line 9 formed of a reciprocating wiring line over which the frequency-divided clock B-CLK output by the main DLL circuit 7 is transferred.

A symbol NC2 denotes a return point of the frequency-divided clock line 9, and NC3 and NC4 denote nodes on the frequency-divided clock line 9 located at an identical distance measured from the return point NC2. A symbol NB2 denotes a node on the internal clock line 8 corresponding to the return point NC2. A symbol NB3 is a node on the internal clock line 8 corresponding to the node NC3.

The wiring distance between the output terminal NB1 of the main DLL circuit 7 for the internal clock I-CLK and the node NB2 is equal to the wiring distance between the output terminal NC1 of the main DLL circuit 7 for the frequency-divided clock B-CLK1 and the return point NC2. Further, the wiring distance between the node NB2 and the node NB3 is equal to the wiring distance between the return point NC2 and the node NC3.

In the present embodiment, the main DLL circuit 7 drives the internal clock I-CLK and the frequency-divided clock B-CLK1 so that a frequency-divided clock B-CLK1-NC2 obtained at the return point NC2 on the frequency-divided clock line 9 is synchronized with the external clock E-CLK.

Further, the clock supply device includes a local DLL circuit 10, which compares the phase of a frequency-divided clock B-CLK1-NC3 obtained at the node NC3 with that of a frequency-divided clock B-CLK1-NC4 obtained at the node NC4, and thus produces the local clock L-CLK synchronized with the frequency-divided clock B-CLK1-NC2 obtained at the return node NC2, that is, synchronized with the internal clock I-CLK-NB2 obtained at the node NB2.

Figure 4:
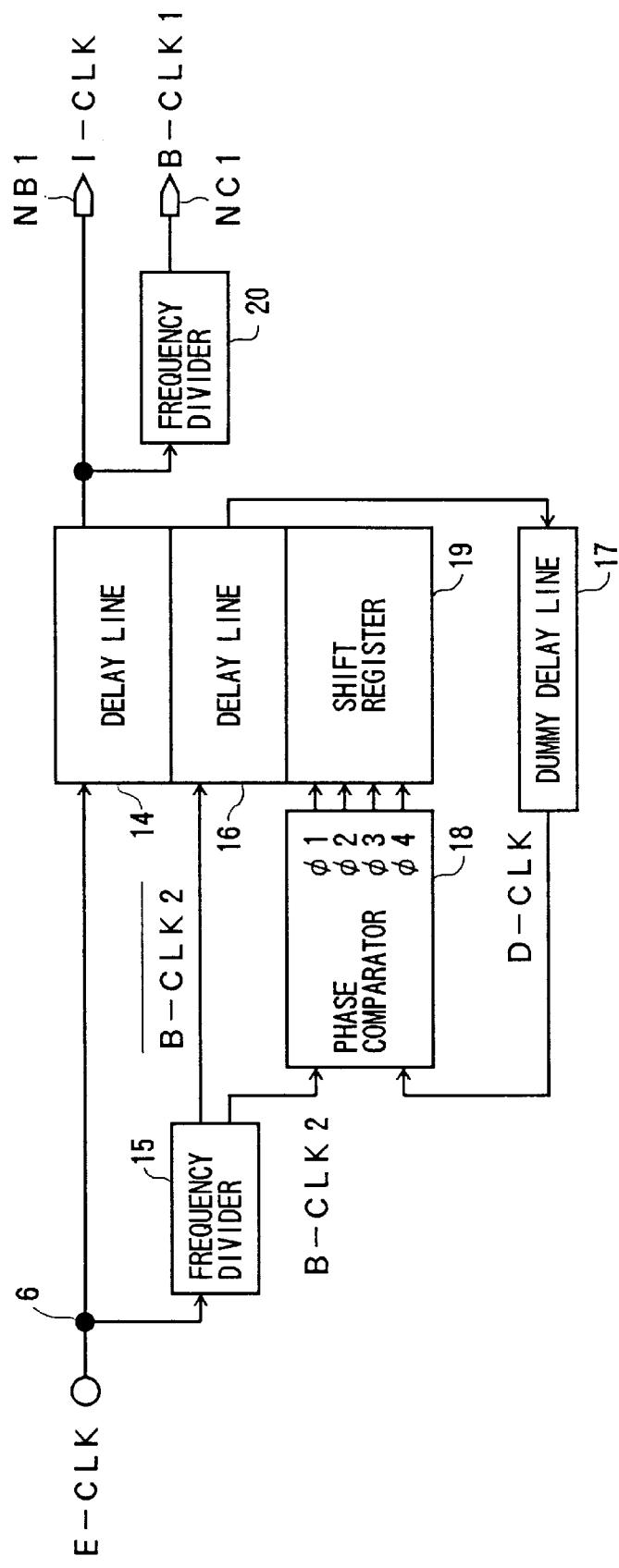
FIG. 4 is a block diagram of a main DLL circuit shown in FIG. 3.

FIG. 4 is a block diagram of the main DLL circuit 7, which includes a delay line 14 having a variable delay time. The delay line 14 delays the external clock E-CLK and thus produces the internal clock I-CLK. Further, the main DLL circuit 7 includes a frequency divider 15, and a delay line 16. The frequency divider 15 divides the frequency of the external clock E-CLK by eight, and thus produces complementary frequency-divided clocks B-CLK2 and /BCLK-2. The delay line 16 delays the frequency-divided clock /B-CLK2 and has the same circuit configuration as that of the delay line 14. The delay line 16 is controlled to have the same delay time as that of the delay line 14.

The main DLL circuit 7 further includes a dummy delay line 17, which has a fixed delay time corresponding to a wiring delay from the output terminal NC1 of the main DLL circuit 7 for the frequency-divided clock B-CLK1 to the return point NC2 on the frequency-divided clock line 9. The dummy delay line 17 delays the output clock from the delay line 16 and thus produces a dummy clock D-CLK, which is synchronized with the frequency-divided clock B-CLK1-NC2 obtained at the return point NC2 on the frequency-divided clock line 9.

The main DLL circuit 7 further includes a phase comparator 18, which compares the phase of the frequency-divided clock B-CLK2 output by the frequency divider 15 with the dummy clock D-CLK output by the dummy delay line 17. The main DLL circuit 7 includes a shift register 19, which controls the delay times of the delay lines 14 and 16 on the basis of phase compare detection signals 01, 02, 03 and 04 output by the phase comparator 18. The main DLL circuit 7 includes a frequency divider 20, which frequency-divides the internal clock I-CLK output by the delay line 14 and thus produces the frequency-divided clock B-CLK1. The frequency divider 20 has the same circuit configuration as that of the frequency divider 15.

Figure 5:
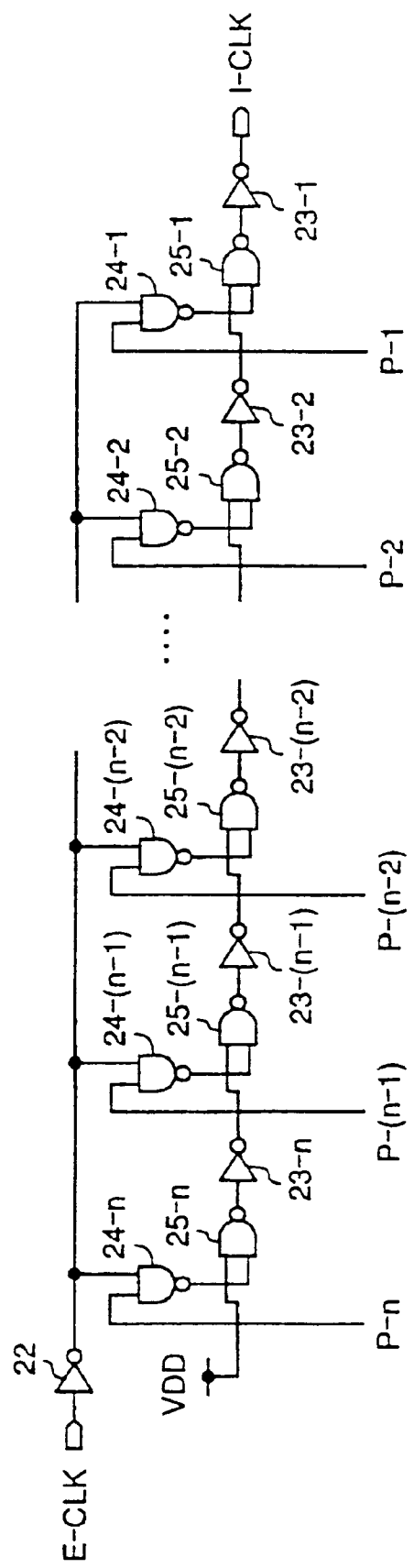
FIG. 5 is a circuit diagram of a delay line 14 shown in FIG. 4.

FIG. 5 is a circuit diagram of a structure of the delay line 14. As shown in FIG. 5, the delay line 14 includes inverters 22, 23-n through 23-1, and NAND circuits 24-n through 24-1, 25-n through 25-1. Symbols P-n through P-1 denote delay time control signals output by the shift register 19. The delay time control signals P-n through P-1 are controlled so that any one of them is set to a high level and the other signals are set to a low level. The delay line 14 has a maximum delay time when the delay time control signal P-n is high, and a minimum delay time when the delay time control signal P-1 is high.

Figure 6:
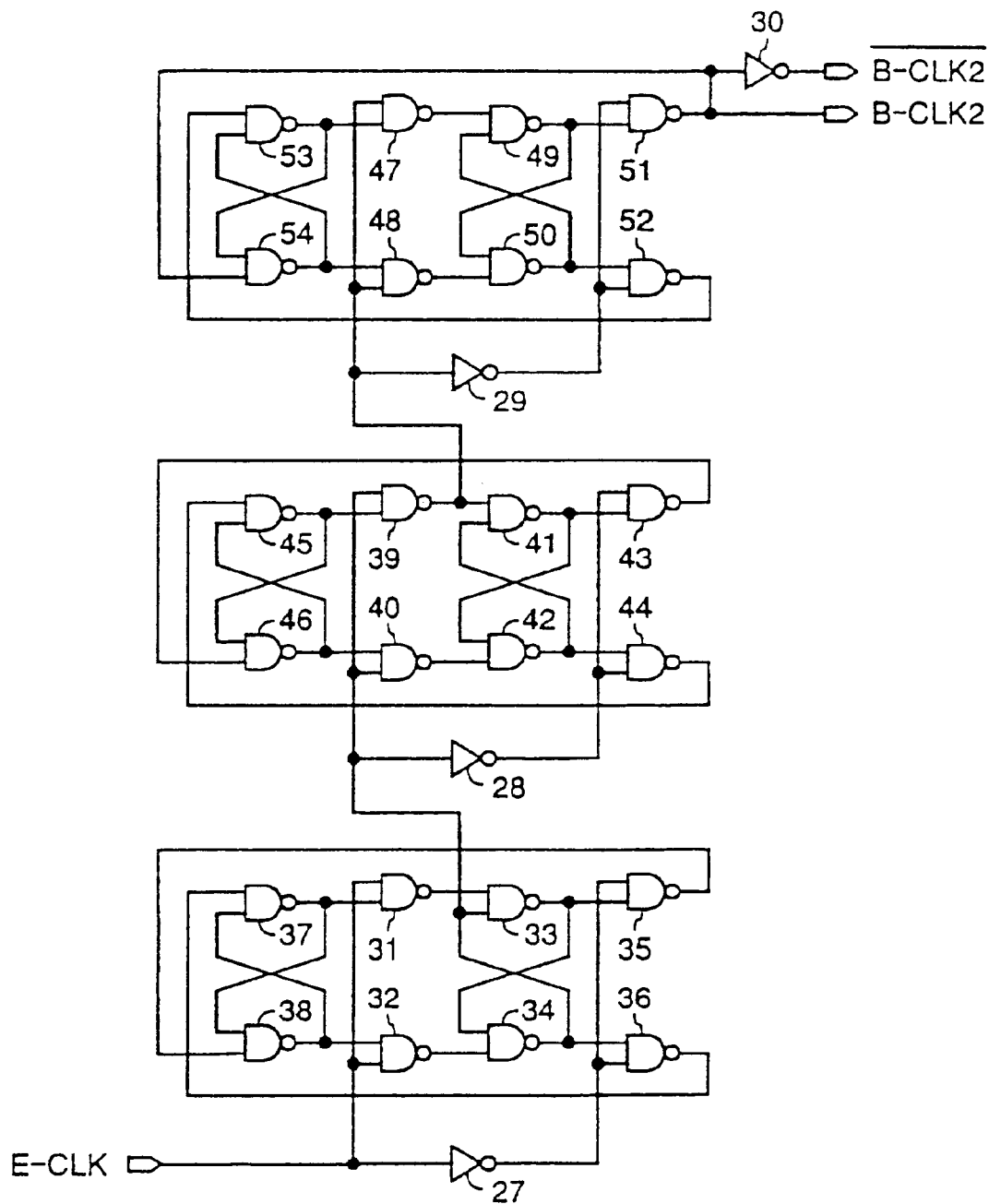
FIG. 6 is a circuit diagram of a frequency divider shown in FIG. 4.

FIG. 6 is a circuit diagram of the frequency divider 15, which has three ½ frequency dividers cascaded and are made up of inverters 27–30 and NAND circuits 31–54.

Figure 7:
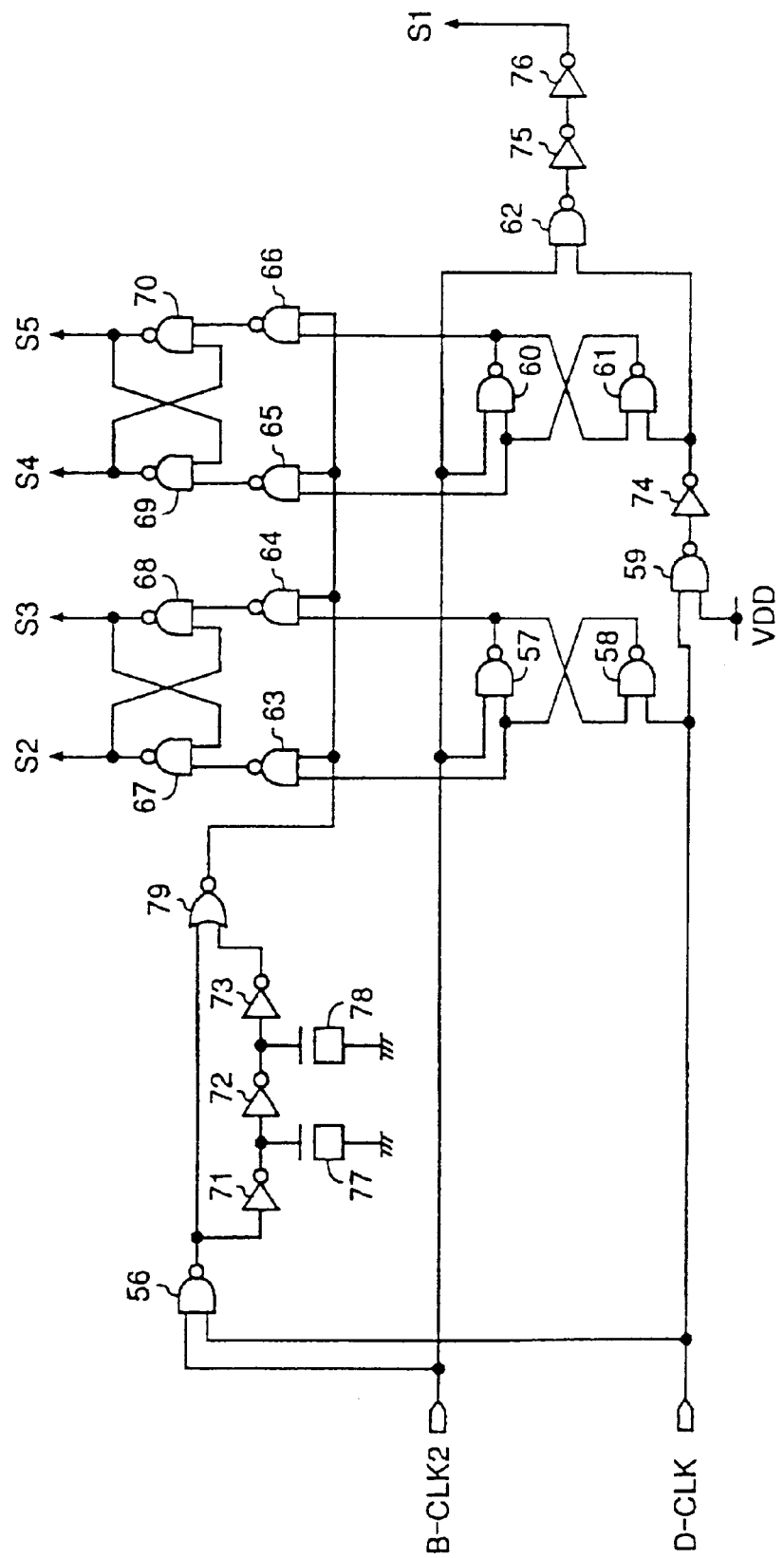
FIG. 7 is a circuit diagram of a first part of a phase comparator 18 shown in FIG. 4.
Figure 8:
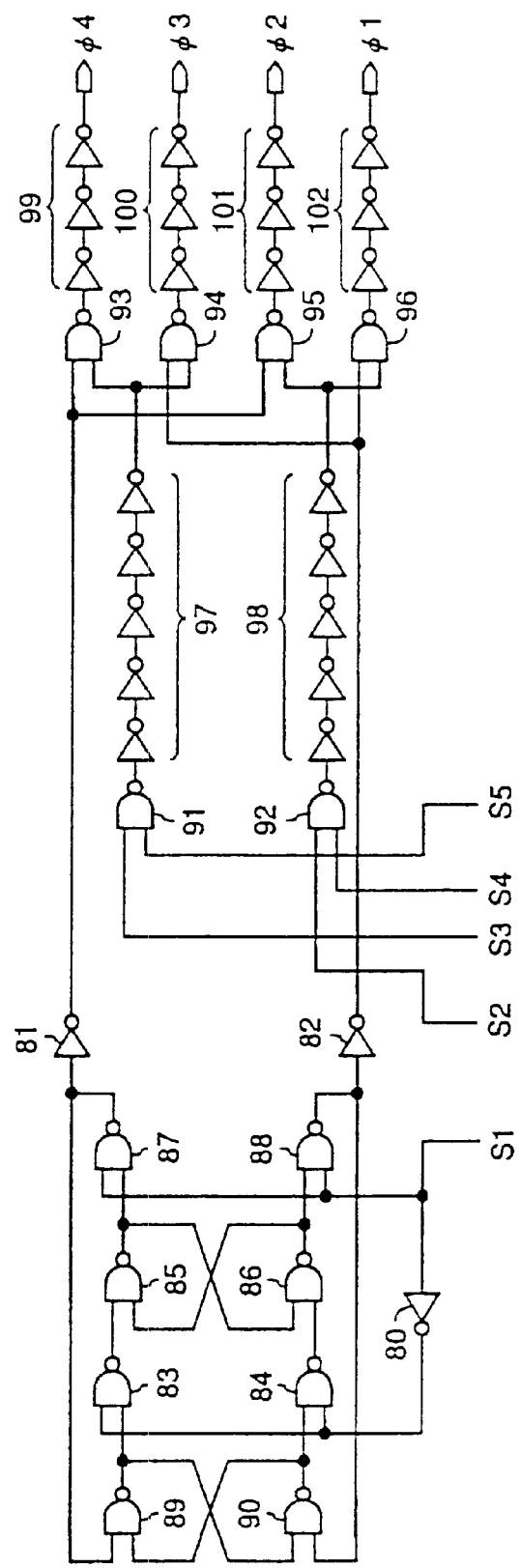
FIG. 8 is a circuit diagram of a second part of the phase comparator 18 shown in FIG. 4.

FIGS. 7 and 8 are circuit diagrams of a structure of the phase comparator 18, which includes NAND circuits 56 through 70, inverters 71–76, MO capacitors 77 and 78, and a NOR circuit 79. These elements are shown in FIG. 7. Further, the phase comparator 18 includes inverters 80–82, NAND circuits 83–96, and buffer circuits 97–102, each having inverters cascaded as shown in FIG. 8.

Figure 9:
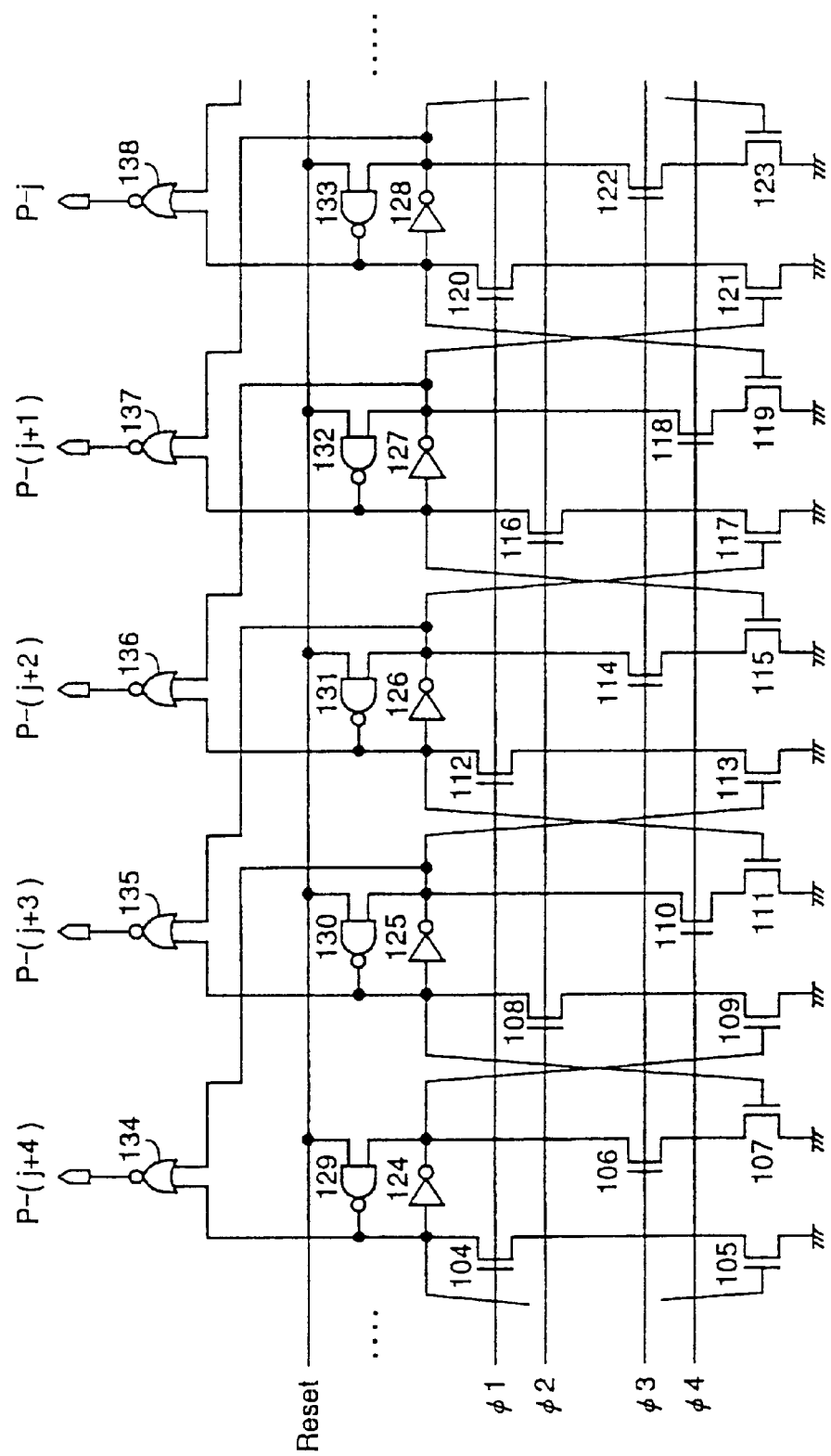
FIG. 9 is a circuit diagram of a shift register 19 shown in FIG. 4.

FIG. 9 is a circuit diagram of the shift register 19, which includes nMOS transistors 104 through 123, inverters 124 through 128, NAND circuits 129 through 133, and NOR circuits 134 through 138. Symbols P-(j+4) through P-j denote delay time control signals, and Reset denotes a reset signal.

Figure 10:
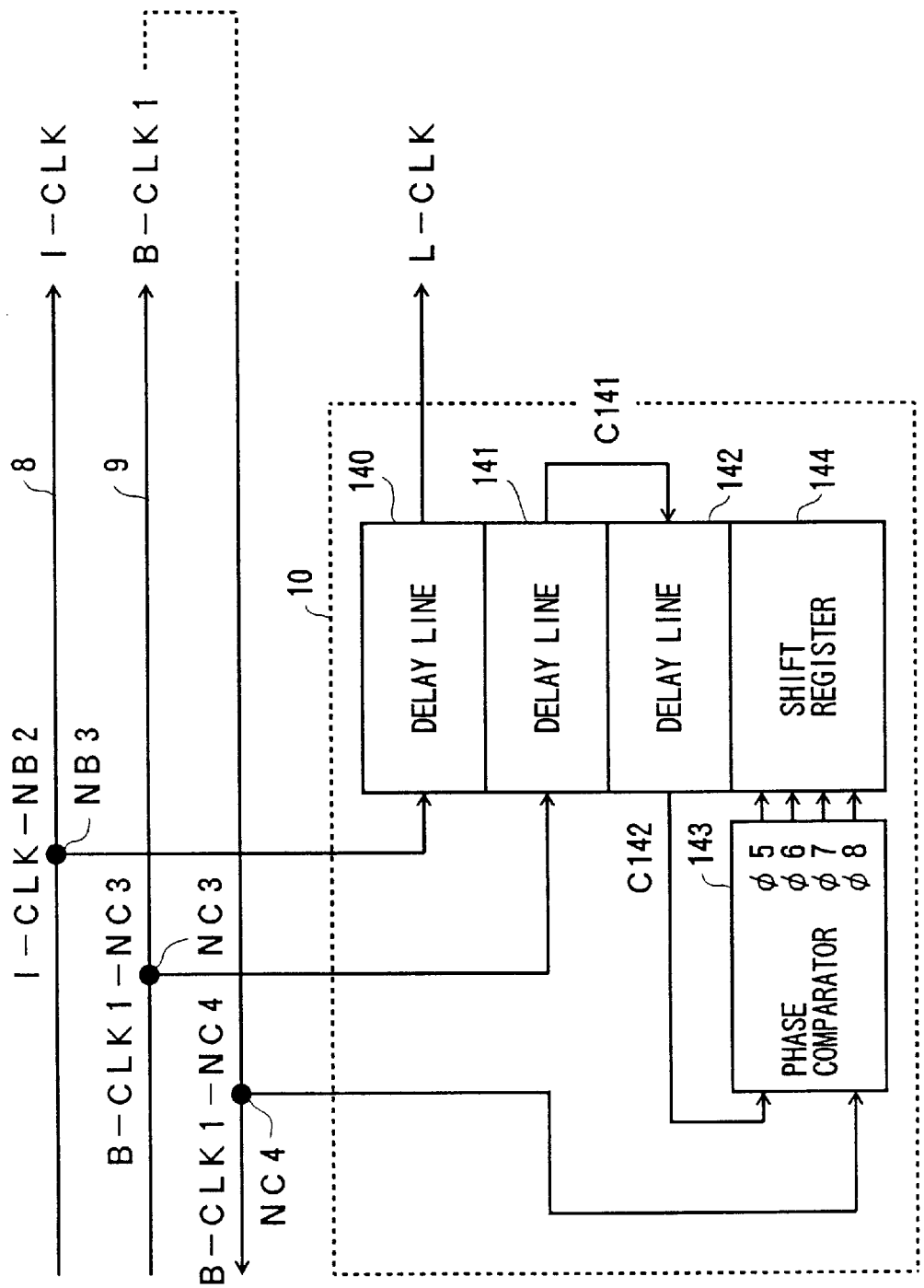
FIG. 10 is a block diagram of a local DLL circuit shown in FIG. 3.

FIG. 10 is a block diagram of a structure of the local DLL circuit 10, which includes a delay line 140 which delays the internal clock I-CLK-NB2 obtained at the node NB3 on the internal clock line 8, and thus produces the local clock L-CLK. The delay line 140 has the same circuit configuration as that of the delay line 14. The local DLL circuit 10 also includes a delay line 141, which delays the frequency-divided clock B-CLK1-NC3 obtained at the node NC3 on the frequency-divided clock line 9 and has the same configuration as that of the delay line 140. The delay line 141 is controlled to have the same delay time as that of the delay line 140.

The local DLL circuit 10 includes a delay line 142, which delays an output clock C141 of the delay line 141 and has the same circuit configuration as that of the delay line 140. The delay line 142 is controlled to have the same delay time as that of the delay line 140.

In the present configuration, the frequency-divided clock B-CLK1-NC3 obtained at the node NC3 on the frequency-divided clock line 9 is delayed, due to the function of the delay lines 141 and 142, by a time equal to twice the delay time caused by the delay line 140.

Further, the local DLL circuit 10 includes a phase comparator 143, which compares the phase of the frequency-divided clock B-CLK1-NC4 obtained at the node NC4 on the frequency-division clock line 9 with that of an output clock C142 of the delay line 142. The phase comparator 143 has the same circuit configuration as that of the phase comparator 18. The local DLL circuit 10 includes a shift register 144, which controls the delay times of the delay lines 140, 141 and 142 on the basis of phase compare detection signals φ5, φ6, φ7 and φ8 output by the phase comparator 144, and has the same circuit configuration as that of the shift register 19.

Figure 11:
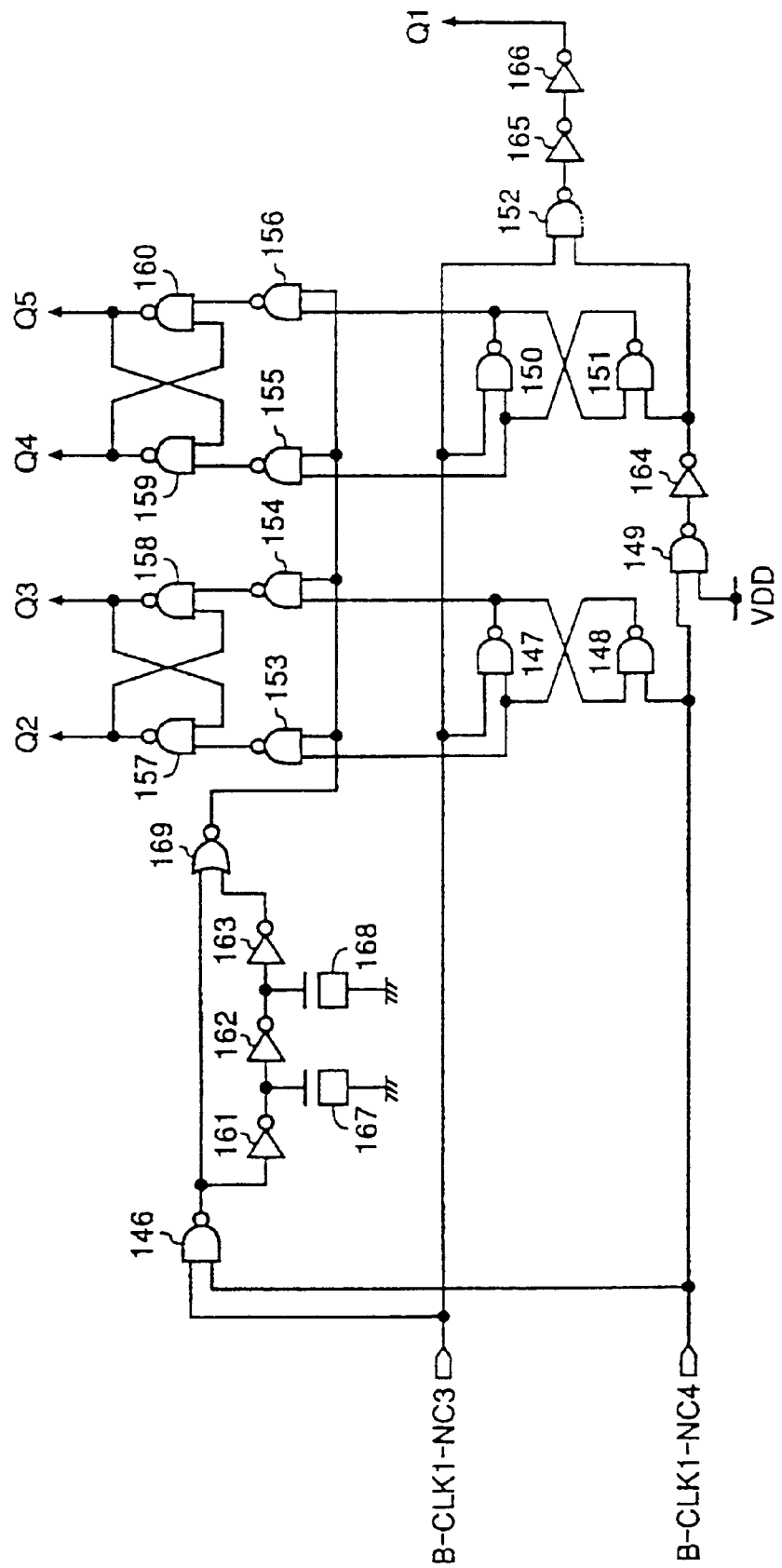
FIG. 11 is a circuit diagram of a first part of a phase comparator 143 shown in FIG. 10.
Figure 12:
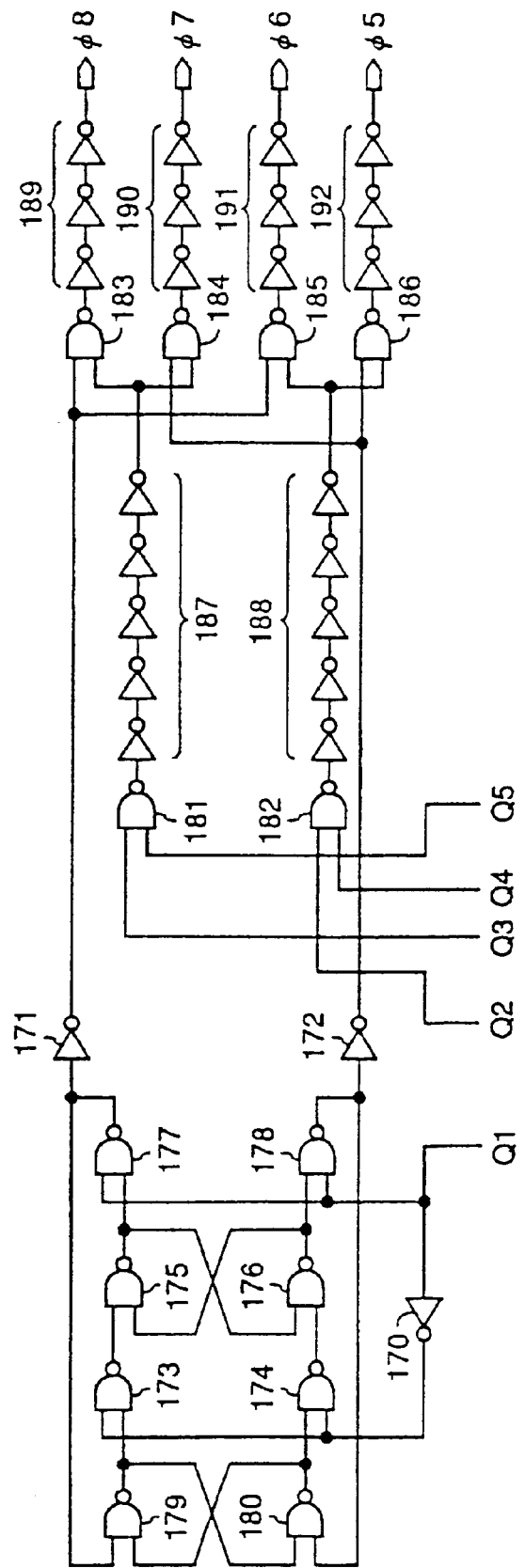
FIG. 12 is a circuit diagram of a second part of the phase comparator 143 shown in FIG. 10.

FIGS. 11 and 12 are circuit diagrams of a structure of the phase comparator 143. The part of the phase comparator 143 shown in FIG. 11 includes NAND circuits 146 through 160, inverters 161 through 166, MOS capacitors 167 and 168, and a NOR circuit 169. The part of the phase comparator 143 shown in FIG. 12 includes inverters 170 through 172, NAND circuits 173 through 186, and buffer circuits 187 through 192, each having inverters cascaded.

Figure 13:
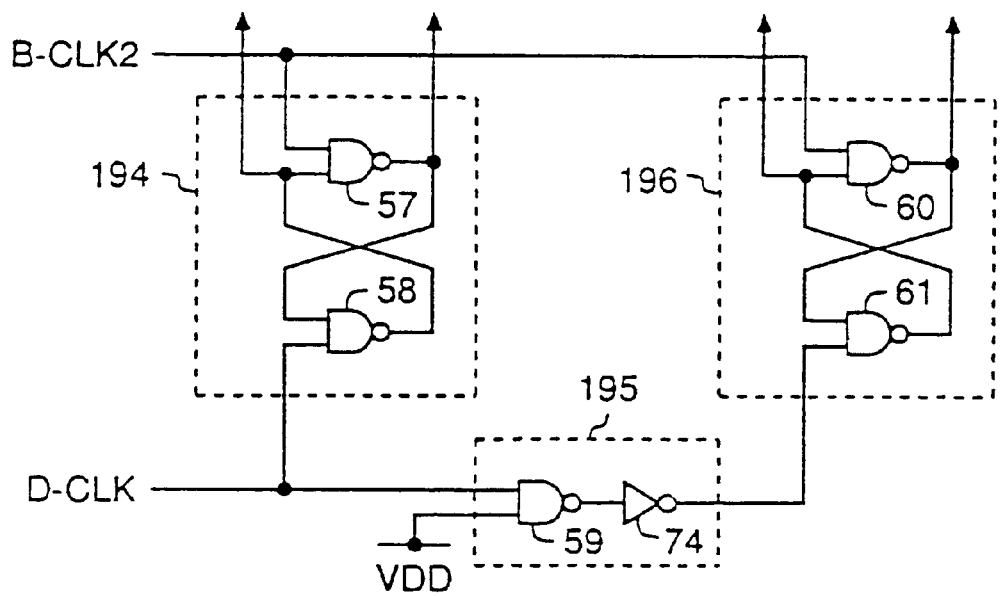
FIG. 13 is a circuit diagram of a phase comparator 18.

FIG. 13 is a circuit diagram of the phase comparator circuit 18 provided in the main DLL circuit 7. The phase comparator 18 includes a phase comparator circuit 194, a delay circuit 195 and a phase comparator circuit 196. The phase comparator circuit 194 includes NAND circuits 57 and 58, and compares the phase of the dummy clock D-CLK (compared clock) with that of the frequency-divided clock B-CLK2 (reference clock). The delay circuit 195 includes a NAND circuit 59 and an inverter 74, and delays the dummy clock signal D-CLK. The phase comparator circuit 196 includes NAND circuits 60 and 61, and compares the phases of the frequency-divided clock B-CLK and the output signal of the delay circuit 195 with each other.

Hence, the phase adjusting error of the phase comparator 18, that is, the phase adjusting error of the dummy clock D-CLK with the frequency-divided clock B-CLK2 is negative. When the delay circuit 195 has the delay time td, the phase adjusting error of the dummy clock signal D-CLK with respect to the frequency-divided clock B-CLK2 is equal to −td.

Figure 14:
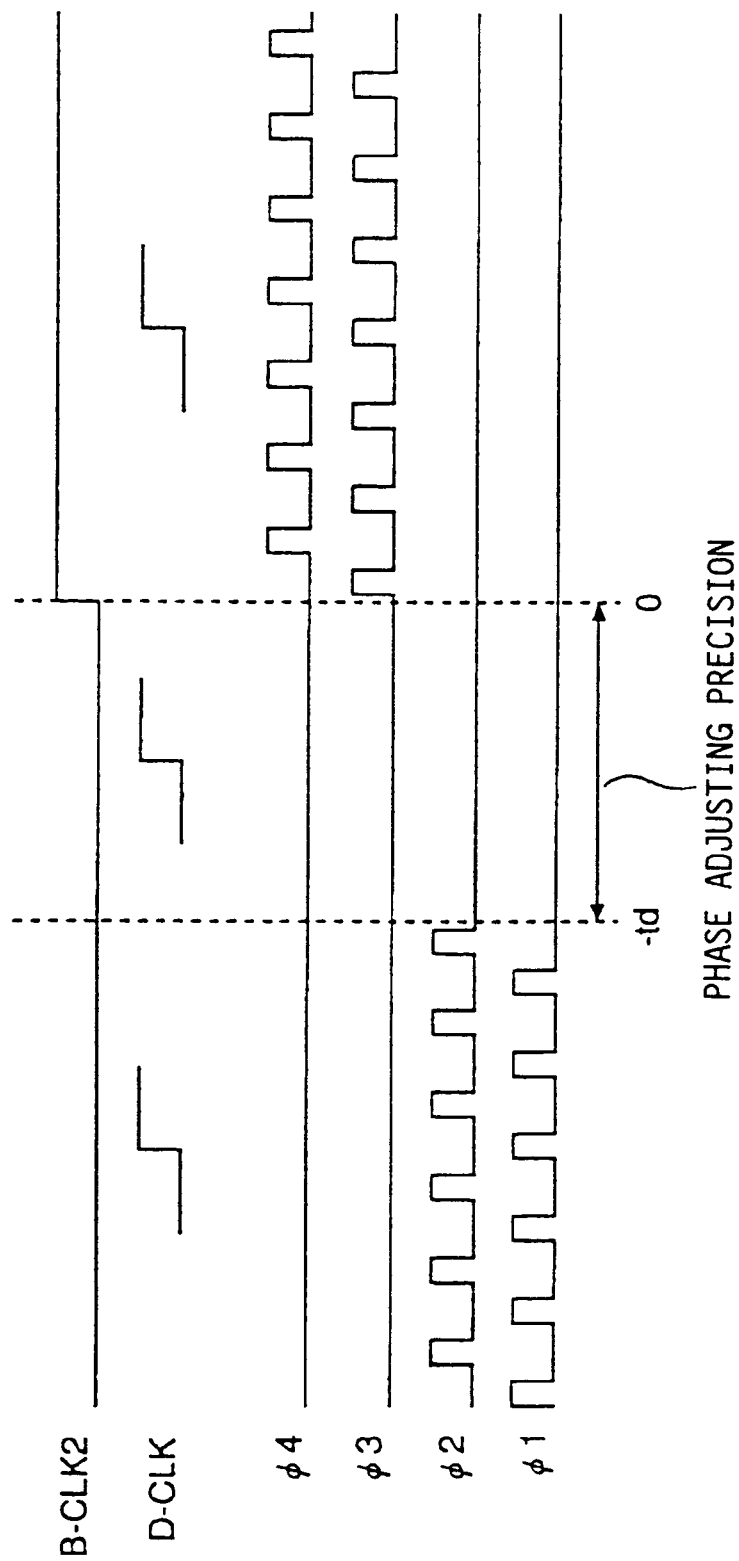
FIG. 14 is a timing chart of an operation of the phase comparator 18.

FIG. 14 is a timing chart of an operation of the phase comparator 18. When the phase difference between the frequency-divided clock B-CLK2 and the dummy clock D-CLK falls within the range between −td and 0, the phase compare detection signals 01, 02, 03 and 04 are maintained at the low level, and the shift register 19 maintains the current values of the delay time control signals P-n through P-1. Hence, the delay times of the delay lines 14 and 16 are maintained at the current values.

If the dummy clock D-CLK leads to the frequency-divided clock B-CLK2 by td or more, the phase compare detection signals φ1 and φ2 are alternately switched to the high level and the low level, while the phase compare detection signals φ3 and φ4 are maintained at the low level. Hence, the shift register 19 varies the values of the delay time control signals P-n through P-1 so that the delay lines 14 and 16 have an increased delay time in order to prevent the dummy clock D-CLK from leading to the frequency-divided clock B-CLK2 by a time exceeding the time td.

If the dummy clock D-CLK lags behind the frequency-divided clock B-CLK2, the phase compare detection signals φ3 and φ4 are alternately switched to the high level and the low level, while the phase compare detection signals φ1 and φ2 are maintained at the low level. Hence, the shift register 19 varies the values of the delay time control signal P-n through P-1 so that the delay lines 14 and 16 have a reduced delay time in order to prevent the dummy clock D-CLK from lagging behind the frequency-divided clock B-CLK2.

Figure 15:
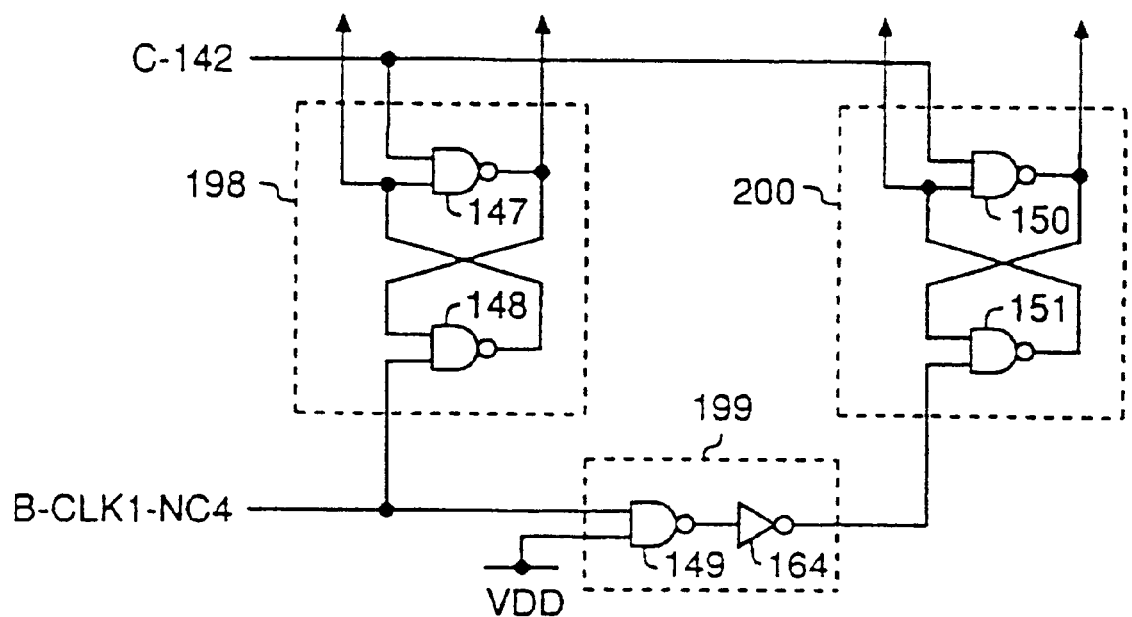
FIG. 15 is a circuit diagram of a phase comparator 143.

FIG. 15 is a circuit diagram of a structure of the phase comparator 143 provided in the local DLL circuit 10. The phase comparator 143 includes a phase comparator circuit 198, a delay circuit 199 and a phase comparator circuit 200. The phase comparator circuit 198 includes NAND circuits 147 and 148 and compares the phase of the output clock C142 (compared clock) of the delay line 142 with that of the frequency-divided clock B-CLK1 (reference clock). The delay circuit 199 includes a NAND circuit 149 and an inverter 164, and delays the frequency-divided clock B-CLK1. The phase comparator circuit 200 includes NAND circuits 150 and 151, and compares the phases of the output clock of the delay circuit 199 and the output clock C142 of the delay line 142 with each other.

Hence, the phase adjusting error of the phase comparator 143, that is, the phase adjusting error of the output clock C142 of the delay line 142 with respect to the frequency-divided clock B0CLK1-NC4 is positive. When the delay time of the delay circuit 199 is td, the phase adjusting error of the output clock C142 of the delay line 142 with respect to the frequency-divided clock B-CLK1-NC4 is +td.

FIG. 16 is a timing chart of an operation of the phase comparator 143. When the time difference between the frequency-divided clock B-CLK1-NC4 and the output clock C142 of the delay line 142 falls within the range between 0 and +td, the phase compare detection signals φ5, φ6, φ7 and φ8 are maintained at the low level. Hence, the shift register 144 maintains the current values of the delay time control signals P-n through P-1, so that the current delay times of the delay lines 140, 141 and 142 are maintained.

If the output clock C142 of the delay line 142 leads to the frequency-divided clock B-CLK1-NC4, the phase compare detection signals φ5 and φ6 are alternately changed to the high level and the low level, while the phase compare detection signals φ7 and φ8 are maintained at the low level. Hence, the shift register 144 varies the values of the delay time control signals P-n through P-1 so that the delay lines 140, 141 and 142 have an increased delay time in order to make the output clock C142 of the delay line 142 lag behind the frequency-divided clock B-CLK1-NC4.

If the output clock C142 of the delay line 142 lags behind the frequency-divided clock B0CLK1-NC4 by the time td or more, the phase compare detection signals φ7 and φ8 are alternately changed to the high level and the low level, while the phase compare detection signals φ5 and φ6 are maintained at the low level. Hence, the shift register 144 varies the values of the delay time control signals P-n through P-1 so that the delay lines 140, 141 and 142 have a decreased delay time in order to prevent the output clock C142 of the delay line 142 from lagging behind the frequency-divided clock B-CLK1-NC4 by td or more.

In the present embodiment, the main DLL circuit 7 operates so that the dummy clock D-CLK output by the dummy delay line 17 is synchronized with the frequency-divided clock B-CLK2 output by the frequency divider 15.

When the dummy clock D-CLK is pulled in synchronization with the frequency-divided clock B-CLK2, the frequency-divided clock B-CLK1-NC2 obtained at the return point NC2 on the frequency-divided clock line 9 becomes synchronized with the frequency-divided clock B-CLK2. Hence, the internal clock I-CLK-NB2 obtained at the node NB2 of the internal clock line 8 synchronized with the frequency-divided clock B-CLK1-NC2 is synchronized with the frequency-divided clock B-CLK2 and is thus synchronized with the external clock E-CLK.

As described above, the main DLL circuit 7 uses, in terms of the circuit configuration, the frequency-divided clock B-CLK2 and the dummy clock D-CLK as the reference clock and the compared clock, respectively. However, the frequency-divided clocks B-CLK2 and B-CLK1-NC2 are substantially used as the reference clock and the compared clock, respectively. Hence, the frequency-divided clock B-CLK1-NC2 is synchronized with the frequency-divided clock B-CLK2, and finally the internal clock I-CLK-NB2 is synchronized with the external clock E-CLK.

The local DLL circuit 10 operates so that the output clock C142 of the delay line 142 is synchronized with the frequency-divided clock B-CLK1-NC4 obtained at the node NC4 of the frequency-divided clock line 9.

When the delay time from the output terminal NC1 of the main DLL circuit 7 to the node NC3 is denoted as α, and the delay time from the node NC3 to the return point NC2, that is, the delay time from the return point NC2 to the node NC4 is denoted as β, the frequency-divided clock B-CLK1-NC3 lags behind the frequency-divided clock B-CLK1-NC1 by α, and the frequency-divided clock B-CLK1-NC4 lags behind the frequency-divided clock B-CLK1-NC1 by α+2β.

In the case where the output clock C142 of the local DLL circuit 10 is synchronized with the frequency-divided clock B-CLK1-NC4, if the delay times of the delay lines 141 and 142 are denoted as TX, then α+2TX=α+2β. Thus, TX=β, that is, the output clock C141 of the delay line 141 is synchronized with the frequency-divided clock B-CLK1-NC2.

Hence, the local clock L-CLK synchronized with the output clock C141 is pulled in synchronization with the frequency-divided clock B-CLK1-NC2 and with the internal clock I-CLK-NB2, and is further synchronized with the external clock E-CLK.

As described above, the local DLL circuit 10 uses, in terms of the circuit configuration, the frequency-divided clocks B-CLK1-NC4 and B-CLK1-NC3 as the reference clock and the compared clock, respectively. However, the frequency-divided clock B-CLK1-NC2 and the output clock C141 of the delay line 141 are substantially used as the reference clock and the compared clock, respectively. Hence, the output clock C141 of the delay line 141 is synchronized with the frequency-divided clock B-CLK1-NC2, and finally the local clock L-CLK is synchronized with the internal clock I-CLK-NB2.

Figure 17A:
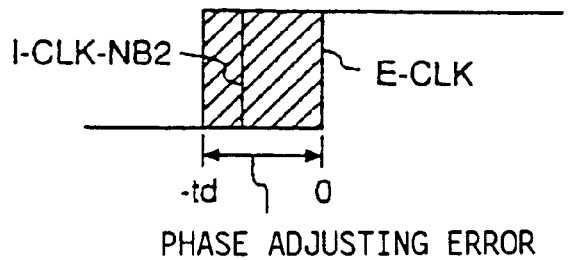
FIGS. 17A, 17B and 17C are timing charts for explaining a phase adjusting error.

In the present embodiment, the operation of synchronizing the internal clock I-CLK-NB2 with the external clock E-CLK is carried out by synchronizing the dummy clock D-CLK with the frequency-divided clock B-CLK2 in the main DLL circuit 7. Hence, the phase adjusting error of the internal clock I-CLK-NB2 with respect to the external clock E-CLK is −td, which is equal to the phase adjusting error of the dummy clock D-CLK with respect to the frequency-divided clock B-CLK2, as shown in FIG. 17A.

Figure 17B:
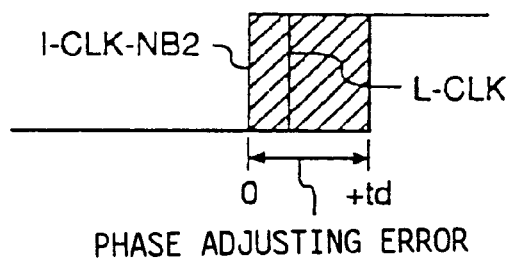

The operation of synchronizing the local clock L-CLK with the internal clock I-CLK-NB2 is carried out by synchronizing the output clock C142 of the delay line 142 with the frequency-divided clock B-CLK1-NC4 in the local DLL circuit 10. Hence, the phase adjusting error of the local clock L-CLK with respect to the internal clock I-CLK-NB2 is +td, which is equal to the phase adjusting error of the output clock C142 of the delay line 142 with respect to the frequency-divided clock B-CLK1-NC4, as shown in FIG. 17B.

Figure 17C:
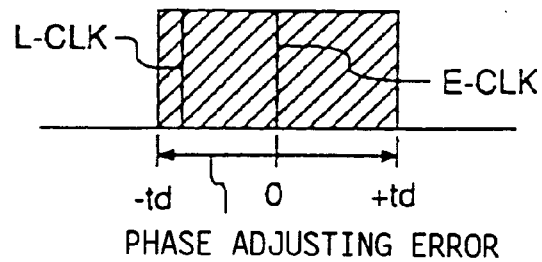

Hence, in the present embodiment, the phase adjusting error of the local clock L-CLK with respect to the external clock E-CLK is equal to +td, as shown in FIG. 17C.

As described above, the present embodiment has the first DLL circuit 7 having the phase adjusting error –td in which, substantially, the frequency-divided clock B-CLK2 is used as the reference clock, and the frequency-divided clock B-CLK1-NC2 is used as the compared clock. In this state, the frequency-divided clocks B-CLK2 and B-CLK1-NC2 are pulled in synchronization with each other. Hence, the internal clock I-CLK-NB2 can be synchronized with the external clock E-CLK. Further, the present embodiment includes the second DLL circuit 10 having the phase adjusting error +td in which, substantially, the frequency-divided clock B-CLK1-NC2 is used as the reference clock, and the output clock C141 of the delay line 141 is used as the compared clock. In this state, the frequency-divided clock B-CLK1-NC2 and the output clock C141 are pulled in synchronization with each other. Hence, the internal clock I-CLK-NC2 can be synchronized with the local clock L-CLK. With the above arrangement, it is possible to reduce the phase adjusting error between the local clock L-CLK and the external clock E-CLK as small as ±td.

In the present embodiment, the main DLL circuit 7 has the phase adjusting error +td, and the local DLL circuit 10 has the phase adjusting error +td. That is, the circuits 7 and 10 have an identical absolute value but the signs thereof are different from each other. Alternatively, the same advantages as described above can be obtained when the main DLL circuit 7 has the phase adjusting error +td and the local DLL circuit 10 has the phase adjusting error –td.

Figure 18:
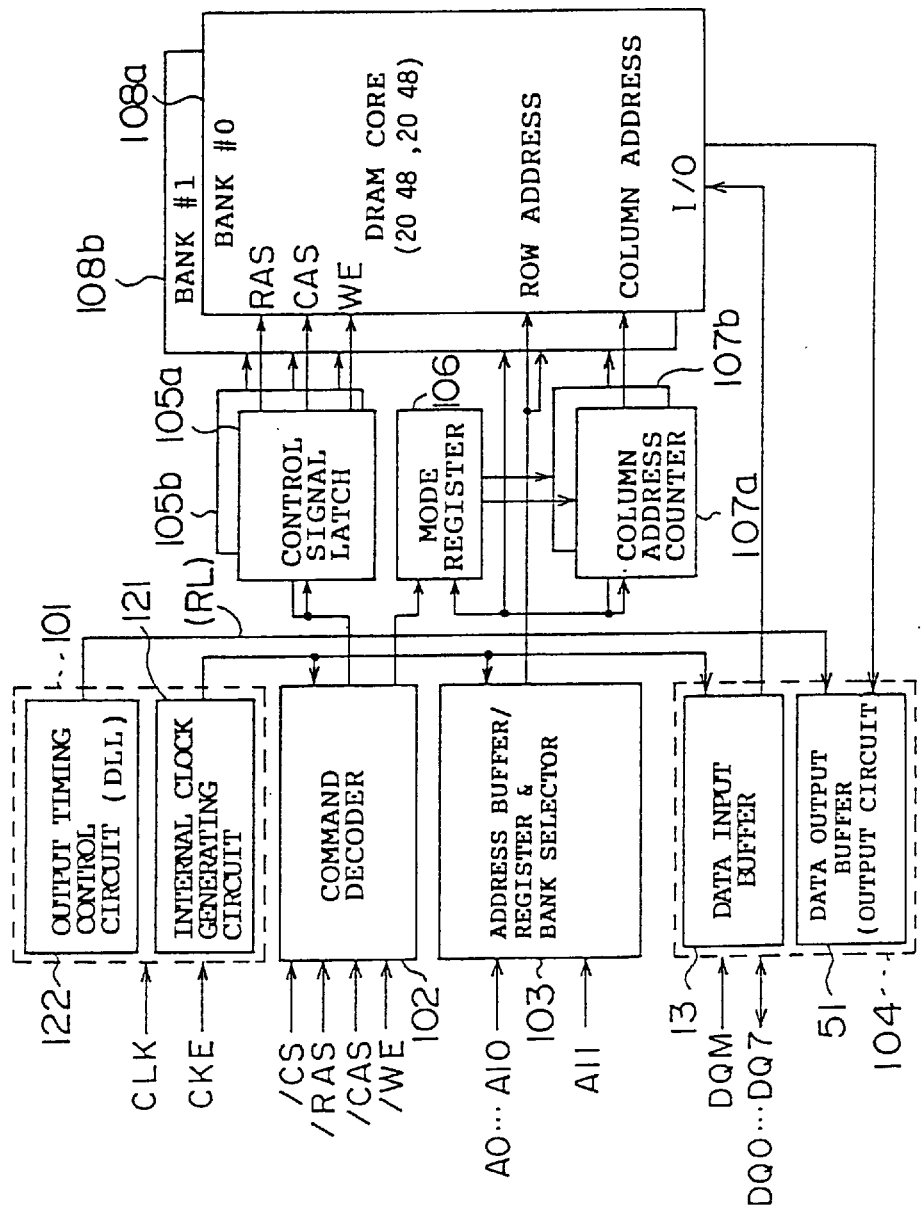
FIG. 18 is a block diagram of an SDRAM device equipped with the electronic device.
Figure 19:
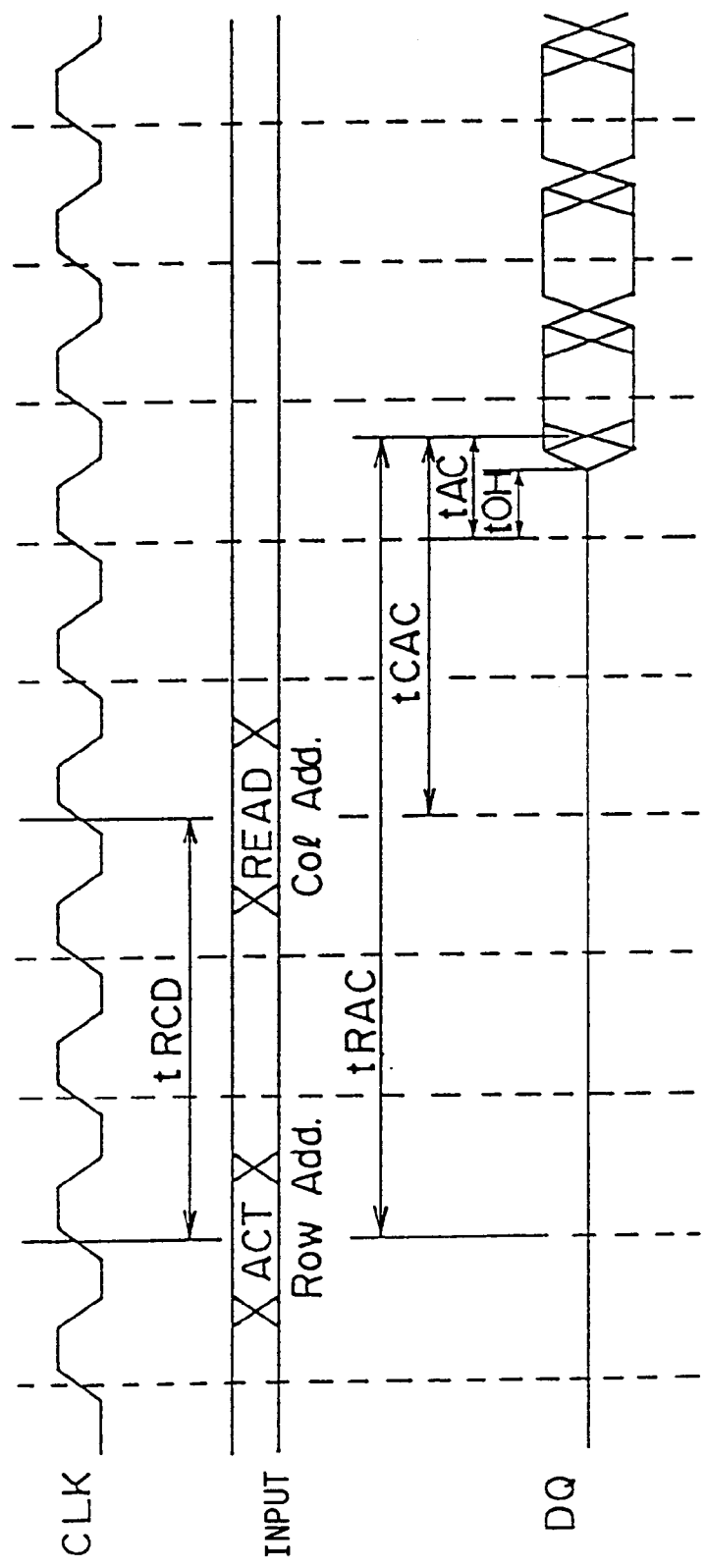
FIG. 19 is a timing chart of an operation of the DRAM device.

FIG. 18 is a block diagram of an SDRAM device to which the above-mentioned clock supply device is applied. FIG. 19 is a timing chart of an operation of the SDRAM device shown in FIG. 18. A pipeline system is applied to the SDRAM device, which includes two banks #0 and #1 each having 16 Mbits and an eight-bit width.

As shown in FIG. 18, the SDRAM device includes DRAM cores 108a and 108b including memory cell arrays having memory cells, a clock buffer 101, a command decoder 102, an address buffer/register and band address selector (address buffer) 103, an I/Do data buffer/register 104, control signal latch circuits 105a and 105b, a mode register 106, and column address counters 107a and 107b. Various commands which define operation modes are defined by a chip select signal /CS, a row address strobe signal /RAS, a column address strobe signal /CAS and a write enable signal /WE. The commands are decoded by the command decoder 102, which controls the corresponding circuits on the basis of the decoded command. The signals /CS, /RAS, /CAS and /WE are applied to the control signal latch circuits 105a and 105b, which hold the states of these signals until the next command is applied.

The address signal is amplified by the address buffer 103, which outputs a row address signal applied to the banks #0 and #1. The row address signal is used as an initial value for the column address counters 107a and 107b.

The clock buffer 101 is equipped with an internal clock generating circuit 121 and an output timing control circuit 122. The internal clock generating circuit 121 generates an internal clock signal from an external clock signal CLK. The output timing control circuit 122 includes the aforementioned clock supply device and performs the fine delay control (phase control) so that the phase-controlled clock signal can be generated.

The I/O data buffer/register 104 is equipped with a data input buffer 13 and a data output buffer (output circuit) 51. Data read from either the DRAM core 108a or 108b is amplified to a given level by the data output buffer 51, and is output via data pads DQ0–DQ7 at the timing of the clock signal output by the output timing control circuit 122. Data externally applied to the data pads DQ0–DQ7 is applied to the DRAM cores 108a and 108b via the data input buffer 13. The clock line 41 corresponds to a line extending from the output timing control circuit 122 to the data output buffer 51.

The read operation of the above SDRAM device will be described with reference to FIG. 19.

The external clock signal CLK is supplied from a system in which the present SDRAM device is used. In synchronism with the rising edges of the external clock signal CLK, various commands, address signal and input data are latched and data is output.

When data is read from the DRAM device, an active command (ACT) defined by the signals /CS, /RAS, /CAS and /WE is applied, and a row address (Row add.) is applied. Hence, the SDRAM device is activated, and the word line corresponding to the row address is selected. Data stored in the cells connected to the selected word line is output to bit lines and is amplified by a sense amplifier.

After the operation time (tRCD) relating to the row address, a read command (READ) and the column address (Col Add.) are input. The data sensed by the sense amplifiers selected by the column address is output to a data bus line and is amplified by a data bus amplifier. Further, the data amplified by the data bus amplifier is amplified by the output buffer 51 and is then output to the data pads DQ. The above operation is the same as that of the general-purpose DRAM device. However, in the SDRAM device, the circuits relating to the column address are designed to perform the pipeline operation, in which read data can be obtained every cycle. Hence, the data output operation has the cycle of the external clock signal CLK.

Generally, there are three different access times, all of which are defined with respect to the rising edges of the external clock signal CLK. In FIG. 19, tRAC denotes a row address access time, tCAC is a column address access time, and tAC denotes a clock access time.

The present invention is not limited to the specifically disclosed embodiments, and variations and modifications may be made without departing from the scope of the present invention.

What is claimed is:

1. An electronic device comprising:
   a first circuit which refers to a first reference quantity and thus drives a second reference quantity; and
   a second circuit which refers to the second reference quantity and thus drives a third reference quantity,
   wherein a first error between the first and second reference quantities has a sign reverse to that of a second error between the second and third reference quantities.

2. An electronic device comprising:
   a first circuit which refers to an external clock and thus produces a first internal clock; and
   a second circuit which refers to the first internal clock and thus produces a second internal clock, wherein the first circuit has a first phase error between the external clock and the first internal clock, and the second circuit has a second phase error between the first internal clock and the second internal clock, the first phase error having a sign reverse to that of the second phase error.

3. The electronic device as claimed in claim 2, wherein the first circuit comprises a first delayed locked loop circuit which synchronizes the external clock and the first internal clock with each other, and the second circuit comprises a second delayed locked loop circuit which synchronizes the first and second internal clocks with each other.

4. The electronic device as claimed in claim 2, wherein the first circuit comprises a first delayed locked loop circuit having the first phase error which has a negative value, and the second circuit comprises a second delayed locked loop circuit having the second phase error which has a positive value.

5. The electronic device as claimed in claim 2, wherein the first circuit comprises a first delayed locked loop circuit having the first phase error which has a positive value, and the second circuit comprises a second delayed locked loop circuit having the second phase error which has a negative value.

6. The electronic device as claimed in claim 2, wherein:
   the first circuit comprises a first delayed locked loop circuit which produces the first internal clock and a first frequency-divided clock from the external clock and outputs the first internal clock and the first frequency-divided clock to first and second clock lines; and
   the second circuit comprises a second delayed locked loop circuit which receives the first internal clock from a first node on the first clock line and the first frequency-divided clock from second and third nodes on the second clock line and produce the second internal clock from the received first internal and first frequency-divided clocks.

7. The electronic device as claimed in claim 2, wherein the first and second phase errors have an identical absolute value.

8. A semiconductor memory device comprising:
   a memory core having memory cells;
   a control circuit which controls the memory core; and
   a timing control circuit which defines an operation timing of the control circuit,
   said timing control circuit comprising:
   a first circuit which refers to an external clock and thus produces a first internal clock; and
   a second circuit which refers to the first internal clock and thus produces a second internal clock applied to the control circuit,
   wherein the first circuit has a first phase error between the external clock and the first internal clock, and the second circuit has a second phase error between the first internal clock and the second internal clock, the first phase error having a sign reverse to that of the second phase error.

9. The semiconductor memory device as claimed in claim 8, wherein the first circuit comprises a first delayed locked loop circuit which synchronizes the external clock and the first internal clock with each other, and the second circuit comprises a second delayed locked loop circuit which synchronizes the first and second internal clocks with each other.

10. The semiconductor memory device as claimed in claim 8, wherein the first circuit comprises a first delayed locked loop circuit having the first phase error which has a negative value, and the second circuit comprises a second delayed locked loop circuit having the second phase error which has a positive value.

11. The semiconductor memory device as claimed in claim 8, wherein the first circuit comprises a first delayed locked loop circuit having the first phase error which has a positive value, and the second circuit comprises a second delayed locked loop circuit having the second phase error which has a negative value.

12. The semiconductor memory device as claimed in claim 8, wherein:
   the first circuit comprises a first delayed locked loop circuit which produces the first internal clock and a first frequency-divided clock from the external clock and outputs the first internal clock and the first frequency-divided clock to first and second clock lines; and
   the second circuit comprises a second delayed locked loop circuit which receives the first internal clock from a first node on the first clock line and the first frequency-divided clock from second and third nodes on the second clock line and produce the second internal clock from the received first internal and first frequency-divided clocks.

13. The semiconductor memory device as claimed in claim 8, wherein the first and second phase errors have an identical absolute value.

* * * * *